United States Patent
Liu et al.

(10) Patent No.: US 10,067,612 B2
(45) Date of Patent: Sep. 4, 2018

(54) ONE GLASS SOLUTION TOUCH PANEL AND MANUFACTURING METHOD THEREOF AND TOUCH PANEL DISPLAY

(71) Applicants: BOE Technology Group Co., Ltd., Beijing (CN); Beijing BOE Optoelectronics Technology Co., Ltd., Beijing (CN)

(72) Inventors: Yingming Liu, Beijing (CN); Haisheng Wang, Beijing (CN); Shengji Yang, Beijing (CN); Liguang Deng, Beijing (CN); Yafeng Duan, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 138 days.

(21) Appl. No.: 14/354,428

(22) PCT Filed: Apr. 10, 2013

(86) PCT No.: PCT/CN2013/074011
§ 371 (c)(1),
(2) Date: Apr. 25, 2014

(87) PCT Pub. No.: WO2014/131227
PCT Pub. Date: Sep. 4, 2014

(65) Prior Publication Data
US 2015/0338953 A1 Nov. 26, 2015

(30) Foreign Application Priority Data
Feb. 26, 2013 (CN) .......................... 2013 1 0060525

(51) Int. Cl.
*G06F 3/044* (2006.01)
*H05K 7/02* (2006.01)
*H05K 3/12* (2006.01)

(52) U.S. Cl.
CPC ........... *G06F 3/044* (2013.01); *H05K 3/1216* (2013.01); *H05K 7/02* (2013.01);
(Continued)

(58) Field of Classification Search
CPC ........... G06F 3/044; G06F 2203/04103; G06F 2203/04111; H05K 7/02; H05K 7/1216; H05K 3/1216; Y10T 29/49149
See application file for complete search history.

(56) References Cited

U.S. PATENT DOCUMENTS

2010/0103119 A1 4/2010 Huang
2012/0013544 A1* 1/2012 Philipp .................. G06F 3/041
345/173

(Continued)

FOREIGN PATENT DOCUMENTS

CN 101430440 A 5/2009
CN 102346593 A 2/2012
(Continued)

OTHER PUBLICATIONS

CN102621736_ENG.pdf, a machine English translation of CN102621736, Published Aug. 1, 2012; Inventors: Liao, Jinyue et. al.*
(Continued)

*Primary Examiner* — Amr Awad
*Assistant Examiner* — Wing Chow
(74) *Attorney, Agent, or Firm* — Ladas & Parry LLP

(57) ABSTRACT

The present disclosure provides a one glass solution touch panel comprising a substrate, a shielding indium tin oxide layer, a black matrix frame arranged on the substrate, metal
(Continued)

wirings arranged above the black matrix frame, a metal bridge formed in a touch sensing region, an insulating layer formed on the metal bridge, indium tin oxide electrode layers arranged on the metal wirings, the metal bridge and the insulating layer, and passivation layers arranged on the indium tine oxide electrode layers. An insulating and protecting layer is at least arranged above the black matrix frame and under the metal wirings. Meanwhile, the present disclosure further provides a method for manufacturing the one glass solution touch panel, and a touch panel display comprising the one glass solution touch panel.

13 Claims, 3 Drawing Sheets

(52) U.S. Cl.
CPC ............. *G06F 2203/04103* (2013.01); *G06F 2203/04111* (2013.01); *Y10T 29/49149* (2015.01)

(56) References Cited

U.S. PATENT DOCUMENTS

| | | | |
|---|---|---|---|
| 2012/0024816 A1 | 2/2012 | Huang et al. | |
| 2012/0105356 A1* | 5/2012 | Brosnan | G06F 3/044 345/174 |
| 2012/0127387 A1* | 5/2012 | Yamato | G06F 3/044 349/42 |
| 2012/0154725 A1* | 6/2012 | Jeon | G02F 1/13338 349/110 |
| 2013/0106746 A1* | 5/2013 | Lai | G06F 3/041 345/173 |
| 2013/0146333 A1* | 6/2013 | Cheng | H05K 3/064 174/250 |

FOREIGN PATENT DOCUMENTS

| | | |
|---|---|---|
| CN | 102681741 A | 9/2012 |
| CN | 102722303 A | 10/2012 |
| CN | 202472596 U | 10/2012 |
| CN | 102799329 A | 11/2012 |
| CN | 102880340 A | 1/2013 |
| CN | 202711205 U | 1/2013 |

OTHER PUBLICATIONS

CN202472596U_ENG.pdf, a machine translation of CN202472596U into English, Published Oct. 3, 2012, made of record in the IDS submitted May 31, 2017.*
International Search Report Appln. No. PCT/CN2013/074011; dated Dec. 5, 2013.
International Preliminary Report on Patentability Appln. No. PCT/CN2013/074011; dated Sep. 1, 2015.
First Chinese Office Action dated May 30, 2016; Appln. No. 201310060525.X.
Second Chinese Office Action dated Nov. 21, 2016; Appln. No. 201310060525.X.
Third Chinese Office Action dated Mar. 31, 2017; Appln. No. 201310060525.X.

* cited by examiner

ONE GLASS SOLUTION TOUCH PANEL AND MANUFACTURING METHOD THEREOF AND TOUCH PANEL DISPLAY

CROSS REFERENCE TO RELATED APPLICATIONS

This application is based on International Application No. PCT/CN2013/074011 filed on Apr. 10, 2013, which claims priority to Chinese National Application No. 201310060525.X filed on Feb. 26, 2013. The entire contents of each and every foregoing application are incorporated herein by reference.

TECHNICAL FIELD

The embodiments of the present invention relate to crystal displaying technology, and particularly to a one glass solution touch panel and a manufacturing method thereof, and a touch panel display.

BACKGROUND

Currently, with the rapid development of the touch panel display, it has become a mainstream flat-panel display. From it appeared till now, the touch panel display is divided into three main types according to structures: out cell touch panel, on cell touch panel, and in cell touch panel. Currently mainstream touch panels mostly adopt the structure design with the out cell touch panel. With the continuous improvement of the optical and electrical properties required by the touch panel display as well as the continuously increasing requirement of the thinning display from customers, within a limited space, and in the case of the display effects remaining unchanged, to design a thin-film transistor with high-performance, low-cost and super-thinness has become a main object of all the manufacturer.

FIG. 1 is a cross-sectional view of the existing out cell one glass solution touch panel, as shown in FIG. 1, which comprises: a substrate 1, a black matrix (BM) frame 2 and a indium tin oxide (ITO) bridge 5 arranged on the substrate 1, an insulating layer 4 arranged on the ITO bridge 5, a ITO electrode layer 3 arranged on the substrate 1, BM frame 2, ITO bridge 5 and insulating layer 4, metal wirings 6 arranged on the ITO electrode layer 3, a passivation layer (PVX) 7 arranged on the ITO electrode layer 3, metal wirings 6 and insulating layer 4, and a flexible printed circuit (FPC) 8 arranged on the metal wirings 6. The shielding ITO layer 9 is arranged on backside of the substrate 1.

During the production process of the above existing one glass solution touch panel, since the position aligning of the ITO bridge 5 adopted at the horizontal and vertical staggered position in the touch panel is difficult, if replacing the ITO bridge 5 with a metal bridge, the position aligning will be easier. However, if directly replacing the ITO bridge 5 in the prior art with a metal bridge, there will be a problem during the preparation, that is, the metal wirings 6 need to be produced first, and then other respective layers are position aligned with the metal wirings 6. This process will cause the metal to bombard the BM frame 2 and further cause the chambers to be polluted.

Moreover, in the production process of the existing one glass solution touch panel, since the shielding ITO layer 9 is made on the backside of the substrate 1, it needs reverse process and the production process is more complicated.

On the other hand, it needs five masks in the whole production process of the existing one glass solution touch panel: a mask 1 for forming the BM frame, a mask 2 for forming the ITO bridge 5, a mask 3 for forming the insulating layer 4, a mask 4 for forming the ITO electrode layer 3, and a mask 5 for forming the protective layer 7, and thereby the cost is high.

SUMMARY

In view of the above mentioned problem of the prior art, the main purpose of the present disclosure is to provide a one glass solution touch panel and a manufacturing method thereof and a touch panel display, such that during the production process of the touch panel and when other respective layers are in the position aligning production with the metal wirings, it may prevent metal from sputtering the BM, and ensure the chamber to be clean.

To achieve the above object, a technical solution of the present disclosure is provided as follows.

In one aspect of the present disclosure, it provides a one glass solution touch panel comprising: a substrate, a shielding indium tin oxide layer, a black matrix frame arranged on the substrate, metal wirings arranged above the black matrix frame, a metal bridge formed within a touch sensing region, an insulating layer formed on the metal bridge, indium tin oxide electrode layers arranged on the metal wirings, the metal bridge and the insulating layer, and a passivation layer arranged on the indium tine oxide electrode layer, wherein an insulating and protecting layer is at least arranged above the black matrix frame and under the metal wirings.

In a way of example, the indium tin oxide layer and the shielding black matrix frame are arranged on the same side of the substrate.

In a way of example, at least one of the indium tin oxide electrode layer and the shielding indium tin oxide layer is arranged above the black matrix frame.

In a way of example, the indium tin oxide electrode layer and the metal wirings which are separated by the insulating protective layer are arranged above the black matrix frame.

In a way of example, the shapes of patterns of the black matrix frame and of the shielding indium tin oxide layer are the same.

In a way of example, the shapes of patterns of the passivation layer and that of the black matrix frame are complementary to each other, or the shapes of patterns of the passivation layer and of the shielding indium tin oxide layer are complementary to each other.

In a way of example, the shielding indium tin oxide layer with the same shapes of patterns as the passivation layer is formed on the passivation layer.

In a way of example, wherein the one glass solution touch panel further comprises a flexible printed circuit arranged on the indium tin oxide electrode layer.

In another aspect of the invention, it provides a touch panel display, the touch panel display comprises the above said one glass solution touch panel.

In still another aspect of the invention, it provides a method for manufacturing the one glass solution touch panel comprising: forming a black matrix frame on a substrate; forming a shielding indium tin oxide layer on the substrate formed with the black matrix frame; forming a insulating protective layer on the substrate formed with the shielding indium tin oxide layer; forming metal wirings and a metal bridge on the substrate formed with the insulating protective layer; forming a insulating layer on the substrate formed with the metal bridge; forming a indium tin oxide electrode layer on the substrate forming with the metal wirings, the insulating protective layer, the metal bridge and the insulating layer; and forming a passivation layer on the substrate formed with the insulating layer and the indium tin oxide electrode layer.

In a way of example, the first mask is used to form the black matrix frame and the shielding ITO layer, and the selected photoresist is positive photoresist; the second mask is used to form the metal wirings and the metal bridge; the third mask is used to form the insulating layer; and the forth mask is used to form the indium tin oxide electrode layer, and the first mask is used to form the passivation layer, and the selected photoresist is negative photoresist.

The present disclosure further provides a method for manufacturing the one glass solution touch panel, which comprises: forming a black matrix frame on a substrate; forming an insulating protective layer on the substrate formed with the black matrix frame; forming metal wirings and a metal bridge on the substrate formed with the insulating protective layer; forming an insulating layer on the substrate formed with the metal bridge; forming an indium tin oxide electrode layer on the substrate formed with the metal bridge, the insulating layer, the insulting and protective layer and the metal wirings; forming a passivation layer on the substrate formed with the insulating layer and the indium tin oxide electrode layer, and forming a shielding indium tin oxide layer on the substrate formed with the passivation layer.

In a way of example, the first mask is used to form the black matrix frame and the insulating protective layer and the selected photoresist is positive photoresist; the second mask is used to form the metal wirings and the metal bridge; the third mask is used to form the insulating layer; and the forth mask is used to form the indium tin oxide electrode layer, and the first mask is used to form the passivation layer and the shielding indium tin oxide layer, and the selected photoresist is negative photoresist.

In the one glass solution touch panel and the manufacturing method thereof and the touch panel display comprising the one glass solution touch panel provided in the present disclosure, an insulating and protecting layer is arranged at least above the black matrix frame and under the metal wirings. Therefore, during the production process of the touch panel according to the present disclosure, when other respective layers are in the position aligning production with metal wirings, it may prevent metal from sputtering the BM, and ensure the chamber to be clean.

In addition, the shielding ITO layer and other layers of the one glass solution touch panel are all arranged on the frontal side (i.e., the same side) of the substrate, and thus the reverse process is unnecessary, and the process is relatively simple.

Furthermore, the production process of the touch panel in the present disclosure only needs four masks, which may save the mask costs comparing to the five masks used in the prior art.

In addition, the shielding ITO layer arranged on the BM in the present disclosure may prevent the liquid crystal display (LCD) from interfering signals of the metal wirings surrounding the touch panel.

Furthermore, the shielding ITO layer arranged on the PVX in the present disclosure may prevent the liquid crystal display (LCD) from interfering signals of the display region of the touch panel.

BRIEF DESCRIPTION OF THE DRAWINGS

In order to illustrate the technical solution of the embodiments of the present invention more clearly, the drawings of the embodiments will be briefly described below; it is obvious that the drawings as described below are only related to some embodiments of the present invention, and thus are not limitative of the present invention.

Figure 1:
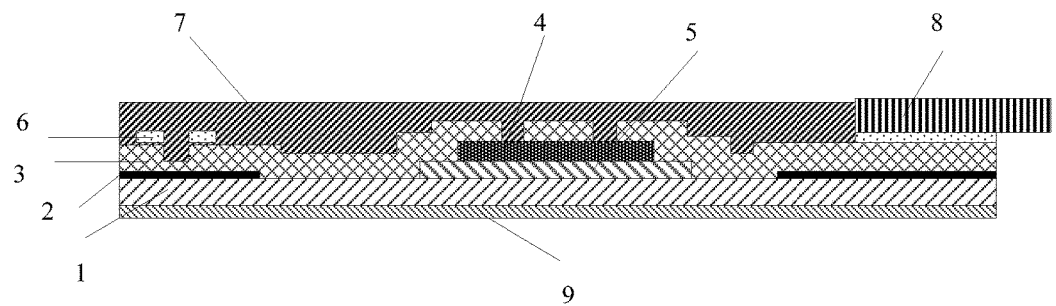
FIG. 1 is a cross-sectional view of the existing out cell one glass solution touch panel.

Reference numerals:

1. substrate; 2. BM frame; 3. ITO electrode layer; 4. insulating layer; 5. ITO bridge; 6 metal wirings; 7. PVX (passivation layer); 8. FPC (flexible printed circuit); 9 shielding ITO layer; 10. insulating layer; 11. metal bridge

DETAILED DESCRIPTION

The technical solutions of the embodiments of the invention will be described in a clearly and fully understandable way in connection with the drawings related to the embodiments of the invention. It is obvious that the described embodiments are just a portion but not all of the embodiments of the invention. According to the embodiments of the invention, all other embodiments obtained by those ordinary skilled in the art under the premise of without creative efforts are all intend to be within the scope of the invention.

Unless otherwise defined, the technical or scientific terms used herein shall have the general meanings understandable for those ordinarily skilled in the field of the present invention. "First", "second" and the like used in specification and claims of the patent application of the present invention do not show any order, number or importance, but are only used to distinguish different constituent portions. Likewise, the words such as "a", "an", "the" or similar shall not represent limitation of numbers, but mean existence of at least one. The phrases such as "include", "comprise" or similar intend to mean the elements or objects before such words cover or are equivalent to the elements or objects listed after such words, but other elements or objects are not exclusive. The phrases such as "connect", "connected" or similar are not limited to physical or chemical connection, but also include electrical connection, no matter directly or indirectly. The phrases such as "upper", "lower", "left", "right" and etc. shall be used only to represent relative positions, wherein when the absolute position of the described object is changed, the relative positions may be changed accordingly.

The basic idea of the present disclosure is that: in order to prevent metal from sputtering the black matrix frame, and ensure the chamber to be clean, during the production process, an insulating protective layer is at least arranged above the black matrix frame and under the metal wirings.

In a way of example, the indium tin oxide layer and the shielding black matrix frame are arranged on the same side of the substrate.

In a way of example, at least one of the indium tin oxide electrode layer and the shielding indium tin oxide layer is arranged above the black matrix frame.

Further, the indium tin oxide electrode layer and the metal wirings which are separated by the insulating protective layer are arranged above the black matrix frame.

Next, the embodiments of the invention will be described in further detail by referring to the accompanying drawings.

Figure 2:
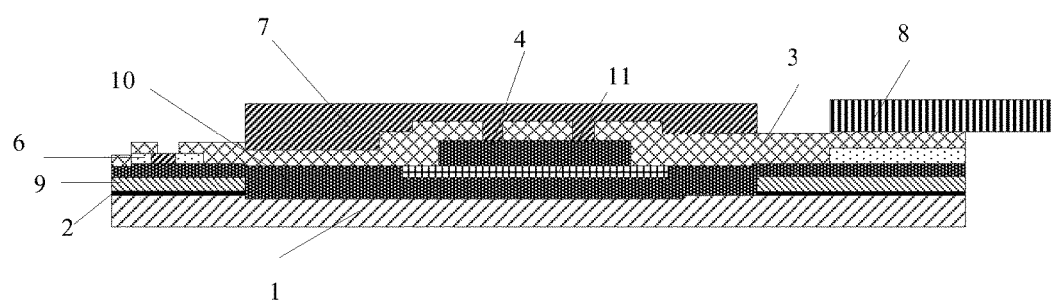
FIG. 2 is a cross-sectional view of the one glass solution touch panel in the first embodiment of the present invention.

FIG. 2 is a structure schematic diagram of the one glass solution touch panel in the first embodiment of the present invention, as shown in FIG. 2, comprising: a BM frame 2 arranged on a substrate 1, a shielding ITO layer 9 arranged on the BM frame 2, a insulating protective layer 10 arranged on the shielding ITO layer 9 and the substrate 1, metal wirings 6 and a metal bridge 11 arranged on the insulating protective layer 10, a insulating layer 4 arranged on the metal bridge 11, an ITO electrode layer 3 arranged on the metal wirings 6, the insulating protective layer 10, the metal bridge 11 and the insulating layer 4, a FPC 8 arranged on the ITO electrode layer 3, and a PVX 7 arranged on the insulating layer 4 and the ITO electrode layer 3.

Wherein, the shapes of patterns of said BM frame 2 and that of the shielding ITO layer 9 are the same; the shapes of patterns of said PVX 7 and that of the BM frame 2 are complementary to each other, or the shapes of patterns of said PVX 7 and that of the shielding ITO layer 9 are complementary to each other.

A shielding ITO layer (not shown in the figures) having the same shapes of patterns as the PVX 7 may be formed on the PVX 7.

Figure 3:
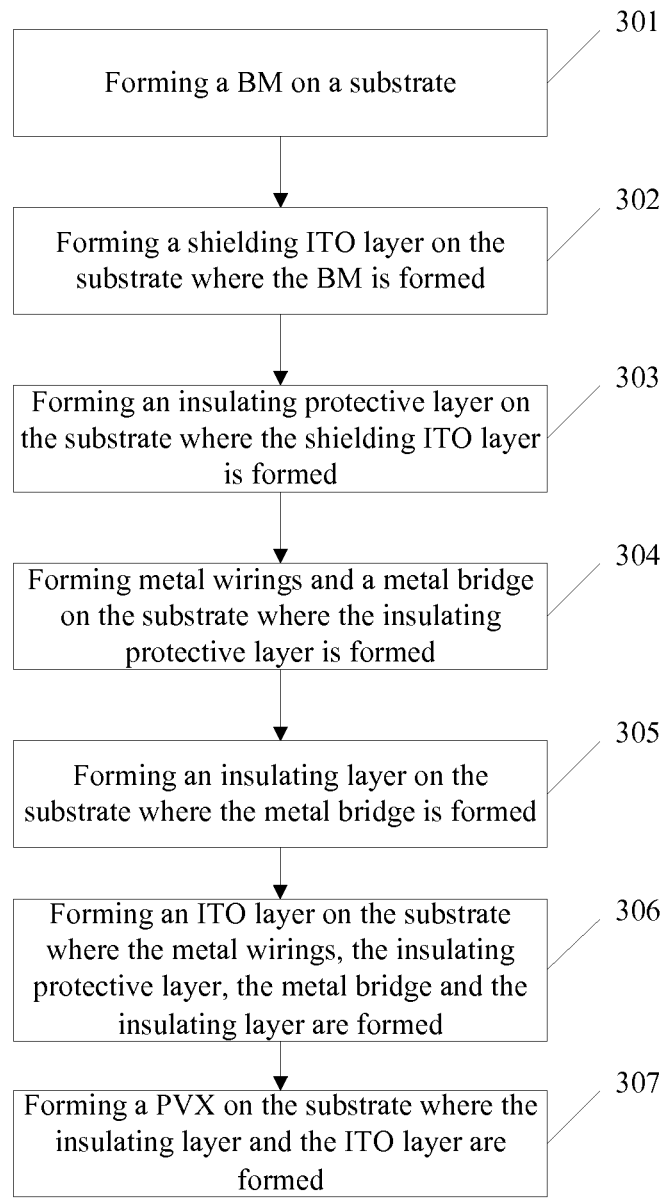
FIG. 3 is a flow diagram of the method for manufacturing the one glass solution touch panel in the first embodiment of the present invention.

The production process of the one glass solution touch panel shown in FIG. 2 will be described in detail below, as shown in FIG. 3, the process comprising the steps as follows.

In step 301, a BM is formed on a substrate.

Wherein, a layer of BM material may be deposited on the substrate 1 using the prior art, and then a BM frame 2 may be formed by a mask process, as shown in FIG. 2. The BM frame 2 is mainly used for blacking lights around the screen and for the arrangement of the metal wirings.

Here, the first mask is used to form said BM frame 2, the first mask may adopt an existing mask; and the selected photoresist is positive gum (positive photoresist).

In step 302, a shielding ITO layer is formed on the substrate where the BM frame 2 is formed.

Wherein, a layer of ITO is deposited on the substrate 1 where the BM frame 2 is formed, and then, the shielding ITO layer 9 is formed by the mask process, as shown in FIG. 2.

Here, the first mask is also used to form said shielding ITO layer 9, which is the same as the mask used to form the BM frame 2, and the selected photoresist is also positive photoresist.

Generally, when the liquid crystal display (LCD) is displaying images, it needs to input signal from peripheral LCD (the signal is usually stronger than the signal in the display region), and this signal will produce a parasitic capacitance to the touch devices disposing on the upper layer of the LCD, which may cause false touch or other interference. Therefore, the shielding ITO layer 9 arranged in the present disclosure can be used to prevent LCD from interfering signals of the metal wirings surrounding the touch panel.

Here, in a way of example, said shielding ITO layer 9 can be arranged on the frontal side of the substrate 1 and at the same side with other layers, thus it becomes unnecessary to perform the reverse process, and then the process is simplified. Moreover, optionally, the shielding ITO layer 9 with only peripheral shapes of patterns (same as the shapes of patterns of the BM frame 2) reserved thereon may effectively shield peripheral signals of the touch panel, such as, AC signals.

In step 303, an insulating protective layer is formed on the substrate where the shielding ITO layer is formed.

Wherein, a layer of insulating material (such as, SiNx or $SiO_2$) is deposited on the substrate 1 and the shielding ITO layer 9, and then the insulating protective layer 10 is formed, as shown in FIG. 2. The insulating protective layer 10 is mainly used to prevent the peripheral BM frame 2 from being sputtered by metal, in which an entire surface deposition method is applied without using masks.

Generally, the BM frame 2 can resist lower temperatures. The shielding ITO layer 9 in the present disclosure can effectively protect the BM frame 2. Performing the entire surface production of the insulating protective layer 10 before producing the subsequent metal wirings 6 can avoid the risk of the metal etching the BM frame 2.

In addition, the insulating protective layer 10 (SiNx and the like) needs to be produced at a lower temperature if without arranging the shielding ITO layer 9, otherwise there will be phenomena of uneven surface, bubbles or the like. Therefore, the arrangement of the shielding ITO layer 9 in the present disclosure also reduces the production difficulty of the insulating protective layer 10, i.e., it can be produced at a high temperature, and thereby reduces the process difficulty in overall.

In step 304, metal wirings and a metal bridge are formed on the substrate where the insulating protective layer is formed.

Wherein, a layer of metal material may be deposited on the substrate 1 where the insulating protective layer 10 is formed, and the metal material may adopt the material used for existing metal wirings, such as, Molybdenum (Mo) and the like, and then the metal wirings 6 and the metal bridge 11 are formed by the mask process, as shown in FIG. 2.

Here, the second mask is used to from the metal wirings 6 and the metal bridge 11.

In step 305, an insulating layer is formed on the substrate where the metal bridge is formed.

Wherein, a layer of insulating material (such as, SiNx of $SiO_2$ and the like) is deposited on the substrate 1 where the metal bridge 11 is formed, and then the insulating layer 4 is formed by the mask process, as shown in FIG. 2.

Here, the third mask is used to form the insulating layer 4.

In step 306, an ITO layer is formed on the substrate where the metal wirings, the insulating protective layer, the metal bridge and the insulating layer are formed.

Wherein, a layer of ITO is deposited on the substrate 1 where the metal wirings 6, the insulating protective layer 10, the metal bridge 11 and the insulating layer 4 are formed, and then the ITO electrode layer 3 may be formed by the mask process, as shown in FIG. 2.

Here, the forth mask is used to form ITO electrode layer 3.

In step 307, a PVX is formed on the substrate where the insulating layer and the ITO layer are formed.

Wherein, a layer of PVX film is deposited on the substrate 1 where the insulating layer 4 and the ITO electrode layer 3 are formed, and then the PVX 7 is formed by the mask process, as shown in FIG. 2.

The PVX 7 is formed by, for example, the first mask, the selected photoresist is negative gum (negative photoresist), and thus the mask costs can be reduced correspondingly.

The method in the present disclosure may further comprise, in a way of example, further forming a shielding ITO layer (not shown) with the same shapes as the PVX 7 on the PVX 7. This helps to further shield the touch electrode of the display region from signal interfering by the display.

Furthermore, the method described in the present disclosure further comprises forming a FPC 8 on the ITO electrode layer 3.

In the above solution of the present disclosure, only four masks are used. However, it needs to use five masks in the prior art. It is obvious that the technical solution of the present disclosure may save the mask costs.

The present disclosure further provides a touch panel display, and the touch panel display comprises the above described one glass solution touch panel.

Figure 4:
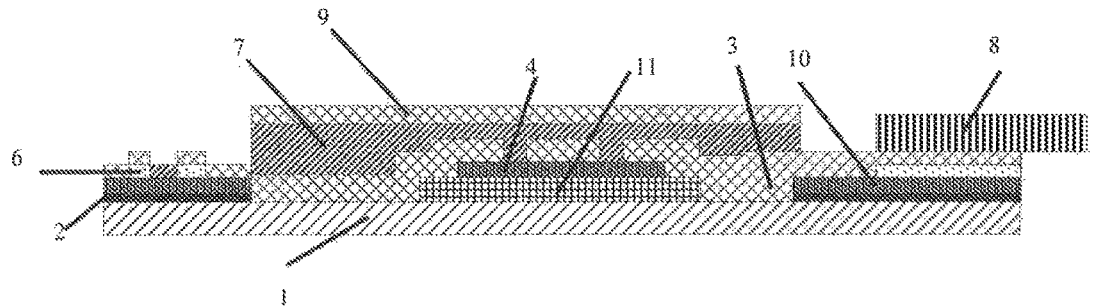
FIG. 4 is a cross-sectional view of the one glass solution touch panel in the second embodiment of the present invention.

FIG. 4 is a structure schematic diagram of the one glass solution touch panel in the second embodiment of the present invention, as shown in FIG. 4, comprising: a BM frame 2 and a metal bridge 11 arranged on a substrate 1, an insulating protective layer 10 arranged on the BM frame 2, metal wirings 6 arranged on the insulating protective layer 10, an insulating layer 4 arranged on the metal bridge 11, an ITO electrode layer 3 arranged on the substrate 1, the metal bridge 11, the insulating layer 4, the insulating protective layer 10 and the metal wirings 6, a PVX 7 arranged on the ITO electrode 3, the insulating layer 4 and the insulating protective layer 10, a shielding ITO layer 9 arranged on the PVX 7, and an FPC 8 arrange on the ITO electrode layer 3.

Wherein, the shapes of patterns of the BM frame 2 and that of the insulating protective layer 10 are the same; the shapes of patterns of the PVX 7 and that of the BM frame 2, or that of the insulating protective layer 10, are complementary to each other, and the shapes of patterns of the shielding ITO layer 9 and that of the BM frame 2, or that of the insulating protective layer 10, are complementary to each other.

Figure 5:
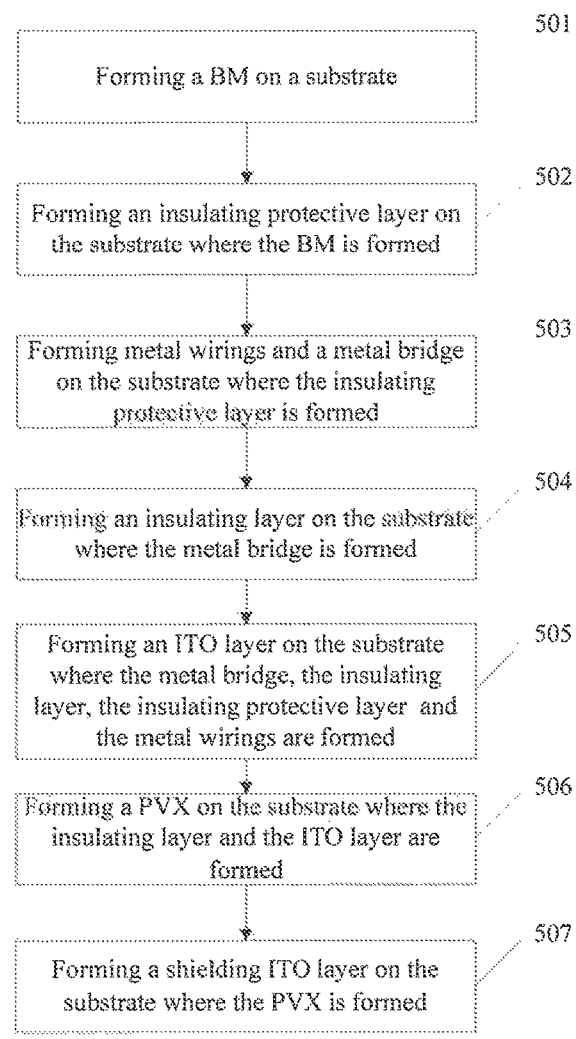
FIG. 5 is a flow diagram of the method for manufacturing the one glass solution touch panel in the second embodiment of the present invention.

The production process of the one glass solution touch panel shown in FIG. 4 will be described in detail as below, as shown in FIG. 5, which comprises steps as follows.

In step 501, a BM is formed on a substrate.

Wherein, a layer of BM material is deposited on a substrate 1 by using the prior art, and then a BM frame 2 is formed by the mask process, as shown in FIG. 4. The BM frame 2 is mainly used for blacking lights around the screen and for arranging metal wirings.

Here, the first mask is used to form the BM frame 2, which may be an existing mask, and the selected photoresist is positive photoresist.

In step 502, an insulating protective layer is formed on the substrate where the BM is formed.

Wherein, a layer of insulating material (such as, SiNx or $SiO_2$) is deposited on the substrate 1 formed with the BM frame 2, and then the insulating protective layer 10 is formed by the mask process, as shown in FIG. 4. The insulating protective layer 10 is mainly used for preventing the peripheral BM frame 2 from being sputtered by metal.

Here, the first mask is also used to form the insulating protective layer 10, and the selected photoresist is also positive photoresist.

In step 503, metal wirings and a metal bridge are formed on the substrate where the insulating protective layer is formed.

Wherein, a layer of metal material is deposited on the substrate 1 formed with the insulating protective layer 10, and the metal material can be materials used in existing metal wirings. Then, the metal wirings 6 and the metal bridge 11 are formed by the mask process, as shown in FIG. 4.

Here, the second mask is used to form the metal wirings 6 and the metal bridge 11.

In step 504, an insulating layer is formed on the substrate where the metal bridge is formed.

Wherein, a layer of insulating material (such as, SiNx or $SiO_2$ and the like) is deposited on the substrate 1 formed with the metal bridge 11, and then the insulating layer 4 are formed by the mask process, as shown in FIG. 4.

Here, the third mask is used to form said insulting layer 4.

In step 505, an ITO layer is formed on the substrate where the metal bridge, the insulating layer, the insulating protective layer, and the metal wirings are formed.

Wherein, a layer of ITO is deposited on the substrate where the metal bridge 11, the insulating layer 4, the insulating protective layer 10, and the metal wirings 6 are formed. Then the ITO electrode layer 3 is formed by the mask process, as shown in the FIG. 4.

Here, the forth mask is used to form said ITO electrode layer 3.

In step 506, a PVX is formed on the substrate where the insulating layer and the ITO layer are formed.

Wherein, a layer of PVX film is deposited on the substrate 1 where the insulting layer 4 and the ITO electrode layer 3 are formed, and then the PVX 7 is formed by the mask process, as shown in FIG. 4.

In a way of example, the PVX 7 may be formed with the first mask, but the selected photoresist is negative photoresist. In this way, the mask costs can be reduced correspondingly.

The process may further comprise a step 507, that is, forming a shielding ITO layer on the substrate where the PVX is formed.

In this step, a layer of ITO is deposited on the substrate where the PVX 7 is formed, and then the shielding ITO layer 9 is formed by the mask process, as shown in FIG. 4.

Here, the arrangement of the shielding ITO layer 9 is mainly used to prevent the liquid crystal display (LCD) from interfering signals of the display region of the touch panel in that the shielding ITO layer may insulate the interference of the LCD signal form the touch devices, i.e., the shielding ITO layer may shield the signal generated by the means of the LCD.

Here, the first mask is used to form the shielding ITO layer 9, and the selected photoresist is negative photoresist.

Further, the method in the present disclosure may further comprise arranging a FPC 8 on the ITO electrode layer 3.

In the above discussed solution, only four masks is used. However, there needs five masks in the prior art. Thus, the mask costs may be saved by using the technical solution discussed in the present disclosure.

The present disclosure further provides a touch panel display. The touch panel display comprises the above mentioned one glass solution touch panel.

What are described above is only illustrative embodiments of the disclosure, but not limitative to the scope of the disclosure. The scopes of the disclosure are defined by the accompanying claims.

What is claimed is:

1. A one glass solution touch panel, comprising:
   a substrate,
   a shielding indium tin oxide layer,
   a black matrix frame arranged on the substrate,
   metal wirings arranged above the black matrix frame,
   a metal bridge formed in a touch sensing region,
   an insulating layer formed on the metal bridge,
   an indium tin oxide electrode layer arranged on the metal wirings, the metal bridge and the insulating layer, and
   a passivation layer arranged on the indium tin oxide electrode layers, wherein an insulating protective layer is at least arranged above the black matrix frame and under the metal wirings, wherein the shielding indium tin oxide layer is arranged between the black matrix frame and the insulating protective layer, and the projection area that the black matrix frame projects onto the substrate is covered by the projection area that the shielding indium tin oxide layer projects onto the substrate, wherein the shielding indium tin oxide layer is in direct contact with the black matrix frame, wherein the shapes of the patterns of the black matrix frame and that of the shielding indium tin oxide layer are the same, and wherein the shapes of patterns of the passivation layer and that of the black matrix frame are complementary to each other.

2. The one glass solution touch panel according to claim 1, wherein the shielding indium tin oxide layer and the black matrix frame are arranged on the same side of the substrate.

3. The one glass solution touch panel according to claim 1, wherein at least one of the indium tin oxide electrode layer and the shielding indium tin oxide layer is arranged above the black matrix frame.

4. The one glass solution touch panel according to claim 1, wherein the indium tin oxide electrode layer and the metal wirings which are separated by the insulating protective layer are arranged above the black matrix frame.

5. The one glass solution touch panel according to claim 1, wherein a second shielding indium tin oxide layer with the same shapes of patterns as the passivation layer is formed on the passivation layer.

6. The one glass solution touch panel according to claim 1, wherein the one glass solution touch panel further comprises a flexible printed circuit arranged on the indium tin oxide electrode layer.

7. A touch panel display, wherein the touch panel display comprises the one glass solution touch panel according to claim 1.

8. The one glass solution touch panel according to claim 1, wherein the shapes of patterns of the passivation layer and that of the shielding indium tin oxide layer are complementary to each other.

9. The one glass solution touch panel according to claim 1, wherein the shielding indium tin oxide layer is arranged between the black matrix frame and the insulating protective layer in a direction perpendicular to the substrate.

10. The one glass solution touch panel according to claim 1, wherein the shielding indium tin oxide layer is a continuous structure.

11. The one glass solution touch panel according to claim 1, wherein
the black matrix frame, the shielding indium tin oxide layer, the insulating protective layer, and the metal wirings are sequentially provided on the substrate.

12. A method for manufacturing the one glass solution touch panel, comprising:
forming a black matrix frame on a substrate;
forming a shielding indium tin oxide layer on the substrate where the black matrix frame is formed;
forming an insulating protective layer on the substrate where the shielding indium tin oxide layer is formed;
forming metal wirings and a metal bridge on the substrate where the insulating protective layer is formed;
forming an insulating layer on the substrate where the metal bridge is formed;
forming a indium tin oxide electrode layer on the substrate where the metal wirings, the insulating protective layer, the metal bridge and the insulating layer are formed;
forming a passivation layer on the substrate where the insulating layer and the indium tin oxide electrode layer are formed,
wherein the shielding indium tin oxide layer is between the black matrix frame and the insulating protective layer, and the projection area that the black matrix frame projects onto the substrate is covered by the projection area that the shielding indium tin oxide layer projects onto the substrate,
wherein the shielding indium tin oxide layer is in direct contact with the black matrix frame, and
wherein a first mask is used to form the black matrix frame and the shielding ITO layer, and the selected photoresist is positive photoresist; a second mask is used to form metal wirings and the metal bridge; a third mask is used to form the insulating layer; and a fourth mask is used to form the indium tin oxide electrode layer; and the first mask is used to form the passivation layer, and the selected photoresist is negative photoresist.

13. A method for manufacturing a one glass solution touch panel, comprising:
forming a black matrix frame on a substrate;
forming an insulating protective layer on the substrate where the black matrix frame is formed;
forming metal wirings and a metal bridge on the substrate where the insulating protective layer is formed;
forming an insulating layer on the substrate where the metal bridge is formed;
forming an indium tin oxide electrode layer on the substrate where the metal bridge, the insulating layer, the insulting protective layer and the metal wirings are formed;
forming a passivation layer on the substrate where the insulating layer and the indium tin oxide electrode layer are formed,
forming a shielding indium tin oxide layer on the substrate where the passivation layer is formed,
wherein the shielding indium tin oxide layer is between the black matrix frame and the insulating protective layer, and the projection area that the black matrix frame projects onto the substrate is covered by the projection area that the shielding indium tin oxide layer projects onto the substrate,
wherein the shielding indium tin oxide layer is in direct contact with the black matrix frame, and
wherein a first mask is used to form the black matrix frame and the insulating protective layer, and the selected photoresist is positive photoresist; a second mask is used to form the metal wirings and the metal bridge; a third mask is used to form the insulating layer; and a fourth mask is used to form the indium tin oxide electrode layer; and the first mask is used to form the passivation layer and the shielding indium tin oxide layer, and the selected photoresist is negative photoresist.

* * * * *